(12) United States Patent
Park et al.

(10) Patent No.: US 8,233,952 B2
(45) Date of Patent: Jul. 31, 2012

(54) SUPERCONDUCTING MAGNET

(75) Inventors: Minseok Park, Hitachinaka (JP);
Tsuyoshi Wakuda, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 35 days.

(21) Appl. No.: 12/977,571

(22) Filed: Dec. 23, 2010

(65) Prior Publication Data
US 2011/0257017 A1    Oct. 20, 2011

(30) Foreign Application Priority Data
Dec. 25, 2009   (JP) ................. 2009-293705

(51) Int. Cl.
*H01B 12/00*    (2006.01)
*H01F 6/00*    (2006.01)
*H01L 29/00*    (2006.01)
(52) U.S. Cl. ........................................ 505/211
(58) Field of Classification Search .................. 505/211, 505/879; 335/216
See application file for complete search history.

(56) References Cited

U.S. PATENT DOCUMENTS

| | | | |
|---|---|---|---|
| 6,194,985 B1 * | 2/2001 | Tanaka et al. | 335/216 |
| 7,196,883 B2 * | 3/2007 | Tsuchiya et al. | 361/19 |
| 2006/0227471 A1 * | 10/2006 | Tsuchiya et al. | 361/19 |

FOREIGN PATENT DOCUMENTS

| | | | |
|---|---|---|---|
| JP | 06069553 A | * | 3/1994 |
| JP | 11102808 A | * | 4/1999 |
| JP | 11-135318 | | 5/1999 |

* cited by examiner

*Primary Examiner* — Colleen Dunn
(74) *Attorney, Agent, or Firm* — Antonelli, Terry, Stout & Kraus, LLP.

(57) ABSTRACT

There is provided a superconducting magnet including a superconducting coil, in which the superconducting coil includes: a bobbin; one or more superconducting wires wound around the bobbin in a plurality of turns, each superconducting wire being one or more superconducting filaments embedded in a matrix; and one or more metallic members, each metallic member being in electrical and thermal contact with a plurality of portions of the one or more superconducting wires.

7 Claims, 5 Drawing Sheets

SUPERCONDUCTING MAGNET

CLAIM OF PRIORITY

The present application claims priority from Japanese patent application serial no. 2009-293705 filed on Dec. 25, 2009, the content of which is hereby incorporated by reference into this application.

BACKGROUND OF THE INVENTION

1. Field of the Invention

The present invention relates to superconducting magnets.

2. Description of Related Art

Because of the recent discovery of high critical temperature superconducting materials (such as high temperature superconducting oxides and $MgB_2$), superconducting magnets can now be operated at relatively high temperatures. For example, superconducting magnets formed of one or more $MgB_2$ superconducting wires having a critical temperature of approximately 30 K (Kelvin, absolute temperature) can be operated at approximately 10 K. An increase in operating temperature leads to cost reduction.

On the other hand, the higher the temperature of a superconducting coil, the higher the specific heat. Therefore, when the temperature of the coil locally increases, the temperatures of the other regions of the coil are less easily elevated. In other words, when a quench (i.e., a loss of superconductivity or a transition to a non-superconducting state) occurs at a region of a superconducting wire, heat due to the quench and the quench itself can less easily propagate into the other regions of the coil. As a result, the temperature of the quench initiation region tends to continue to increase and exceed a maximum allowable level, thereby possibly burning out the coil. Thus, in order to prevent burnout of a superconducting coil caused by a quench, it is important to propagate the quench as fast as possible.

A technique for suppressing quench occurrence in a superconducting magnet is disclosed in JP-A Hei 11(1999)-135318 (hereinafter Hayashi et al). The superconducting magnet of the above disclosure includes: a superconducting coil wound around a bobbin and supported by flanges; one or more good thermal conductive resin inserted through the superconducting coil; a vacuum container for containing and heat insulating the superconducting coil; and a refrigerator that is thermally connected to the superconducting coil in order to cool the coil to a extremely low temperature.

When a quench occurs, a possible disadvantage of the above disclosure is as follows: The resin inserted through the superconducting coil may result in insufficient velocity of the quench propagation because of a limitation of the thermal conductivity of the resin. Thus, for superconducting coils operating at a relatively high temperature of 10 K or higher, the technique of the above disclosure may not prevent burnout of the coil caused by a quench.

SUMMARY OF THE INVENTION

In view of the above problem, it is an objective of the present invention to provide a superconducting magnet which is effectively protected from burnout caused by a quench even when the magnet is operated at a relatively high temperature of 10 K or higher.

According to one aspect of the present invention, there is provided a superconducting magnet including a superconducting coil, in which the superconducting coil includes:

a bobbin;

one or more superconducting wires wound around the bobbin in a plurality of turns, each superconducting wire being one or more superconducting filaments embedded in a matrix; and one or more metallic members, each metallic member being in electrical and thermal contact with a plurality of portions of the one or more superconducting wires.

In the above aspect of the present invention, the following modifications and changes can be made.

(i) The one or more metallic members include a plurality of metallic members, and each pair of neighboring ones of the plurality of metallic members which are next to each other in a circumferential direction of the bobbin is separated from each other by a corresponding slit.

(ii) Each metallic member extends parallel to the outer circumferential surface of the bobbin, and is a block, a sheet, a strip or a net in form.

(iii) Each pair of neighboring ones of the plurality of metallic members that are next to each other in an axial direction of the bobbin is separated from each other by a corresponding slit.

(iv) The one or more superconducting wires include a plurality of superconducting wires, and the plurality of superconducting wires are bundled and surrounded by an insulation cover.

(v) The superconducting magnet is operated at an absolute temperature of 10 K or higher.

(vi) There is provided a nuclear magnetic resonance apparatus including the above described superconducting magnet.

ADVANTAGES OF THE INVENTION

According to the present invention, it is possible to provide a superconducting magnet that is effectively protected from burnout caused by a quench even when the magnet is operated at a relatively high temperature of 10 K or higher.

DETAILED DESCRIPTION OF THE PREFERRED EMBODIMENTS

Figure 1:
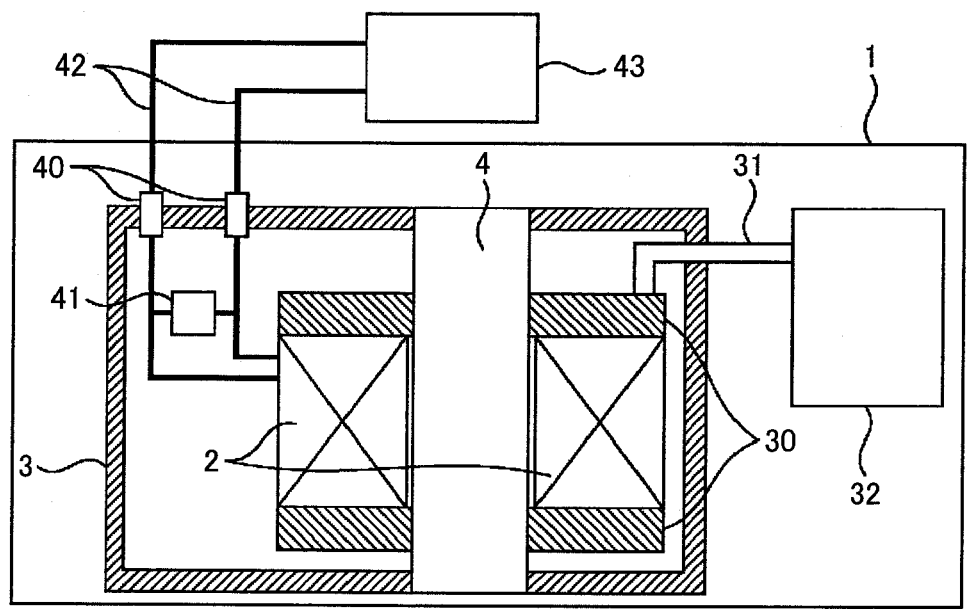
FIG. 1 is a schematic illustration showing a cross sectional view of an exemplary configuration of a superconducting magnet according to the present invention.

Preferred embodiments of the present invention will be described below with reference to the accompanying drawings. The invention is not limited to the specific embodiments described below, but various modifications and combinations are possible without departing from the spirit and scope of the invention. In the drawings, like parts are designated by like reference numerals without repeating the description thereof.

First Embodiment of the Invention

FIG. 1 is a schematic illustration showing a cross sectional view of an exemplary configuration of a superconducting magnet according to the present invention. As shown in FIG. 1, a superconducting magnet 1 of the invention includes a superconducting coil 2. The superconducting coil 2 is contained in a heat insulating container 3. The heat insulating container 3 includes a hollow cylinder 4 that extends through the axial bore of the superconducting coil 2. The superconducting coil 2 is in thermal contact with heat transfer plates 30, which are thermally connected to a refrigerator 32 external to the heat insulating container 3 by means of a cooling pipe 31. In this manner, the superconducting coil 2 is cooled to below the operating temperature of the magnet 1 by the refrigerator 32.

Both ends of the superconducting coil 2 are electrically connected to respective current ports 40. A persistent current switch 41 is connected between the current ports 40 in parallel with the coil 2. The persistent current switch 41 comprises a superconducting wire, which is formed by embedding one or more superconducting filaments in a high electrical resistivity matrix material. The persistent current switch 41 also includes a built-in heater. During the superconducting operation of the superconducting coil 2, the persistent current switch 41 is maintained in a superconducting state by keeping the built-in heater off. When the superconducting coil 2 is being energized or deenergized, the persistent current switch 41 is turned to a non-superconducting state by turning the built-in heater on.

Also, when the superconducting magnet 1 is being energized or deenergized, current leads 42 extending from a current source 43 are connected to the respective current ports 40. During the superconducting operation of the superconducting magnet 1, the current source 43 is detached from the superconducting magnet 1 (i.e., the current leads 42 are disconnected from the current ports 40).

Figure 2:
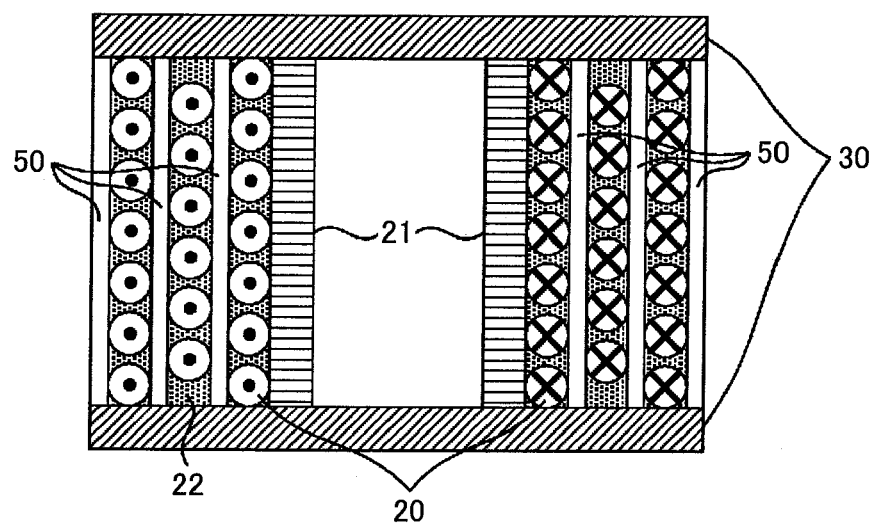
FIG. 2 is a schematic illustration showing a cross sectional view of an exemplary superconducting coil according to a first embodiment of the invention.

FIG. 2 is a schematic illustration showing a cross sectional view of an exemplary superconducting coil according to a first embodiment of the invention. A superconducting coil 2 shown in FIG. 2 is formed by alternately winding turns of a superconducting coil wire 20 and a current and heat conducting portion 50 around a bobbin 21. The spaces among turns of the superconducting coil wire 20 (i.e., the spaces unoccupied by the superconducting coil wire 20 and the current and heat conducting portion 50) are filled with a wire immobilizing material 22. The wire immobilizing material 22 preferably has a high electrical resistivity and a high thermal conductivity. An example of such materials is STYCAST (trade name) available from Henkel Japan Ltd.

Figure 3:
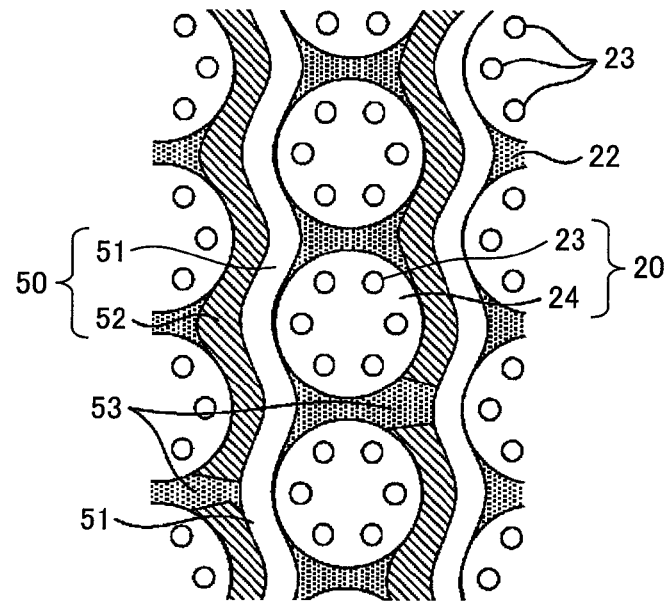
FIG. 3 is a schematic illustration showing an enlarged cross sectional view of a portion of the superconducting coil shown in FIG. 2.

FIG. 3 is a schematic illustration showing an enlarged cross sectional view of a portion of the superconducting coil shown in FIG. 2. As illustrated in FIG. 3, the superconducting coil wire 20 is one or more superconducting filaments 23 embedded in a matrix 24. The matrix 24 preferably has a high thermal conductivity and a low electrical resistivity. An example of such materials is oxygen-free copper. In conventional typical superconducting coil wires, the matrix is surrounded by an insulation layer. However, the superconducting coil wire 20 of the present invention is not covered with any insulation layer in order to achieve the later described quench protection function (effect) of the invention. The current and heat conducting portion 50 is formed by laminating a plurality of metal patches 52 (as metallic members) on an insulation layer 51. The metal patches 52 are made of a metal having good electrical conductance and good thermal conductance (e.g., oxygen-free copper, aluminum, silver and indium). Each metal patch 52 is formed so as to have as large a contact area with adjacent turns of the superconducting coil wire 20 as possible.

Such a material and shape enables each metal patch 52 to establish good electrical contact with the matrices 24 of the adjacent turns of the superconducting coil wire 20. Each pair of axially adjacent metal patches 52 (i.e., each pair of metal patches 52 which are adjacent to each other in the axial (longitudinal) direction of the coil 2) is separated by a circumferential slit 53 extending in the circumferential direction of the coil 2. Each circumferential slit 53 is filled with the above-mentioned wire immobilizing material 22. Thereby, each metal patch 52 is electrically separated from the axially adjacent metal patches 52.

The metal patches 52 of the invention are structurally different from the cooling plate disclosed in the aforementioned Hayashi et al, especially in which the metal patches 52 are not connected to the heat transfer plates 30. This structural difference comes from the fact that the quench protection function and effect of the metal patches 52 is different from the function of the cooling plates employed in Hayashi et al. The detailed quench protection function of the metal patches 52 will be described later.

Figure 4:
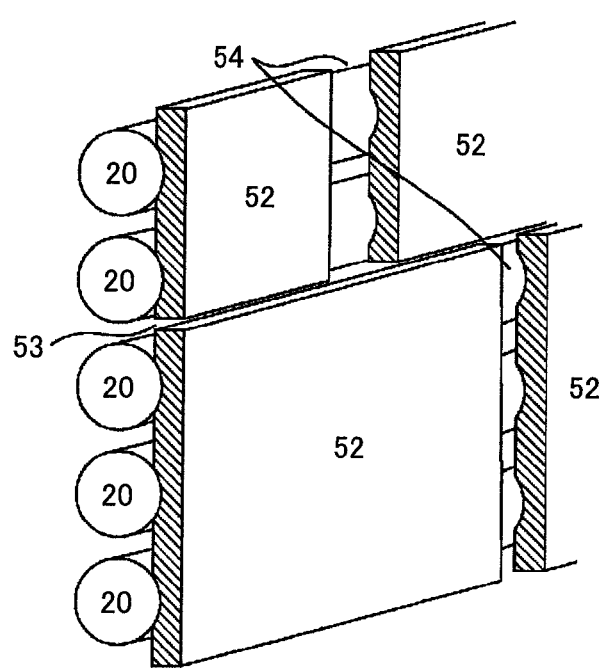
FIG. 4 is a schematic illustration showing a perspective view of an exemplary arrangement of a superconducting coil wire and a metallic member of a current and heat conducting portion according to the first embodiment of the invention.

FIG. 4 is a schematic illustration showing a perspective view of an exemplary arrangement of a superconducting coil wire and a metallic member of a current and heat conducting portion according to the first embodiment of the invention. As shown in FIG. 4, each pair of circumferentially adjacent metal patches 52 (i.e., each pair of metal patches 52 which are adjacent to each other in the circumferential direction of the coil 2) is separated by an axial slit 53 extending in the axial (longitudinal) direction of the coil 2. Similarly to the circumferential slits 53, each axial slit 54 is filled with the wire immobilizing material 22. Thus, all the metal patches 52 are electrically separated from one another by the circumferential and axial slits 53 and 54.

Figure 5:
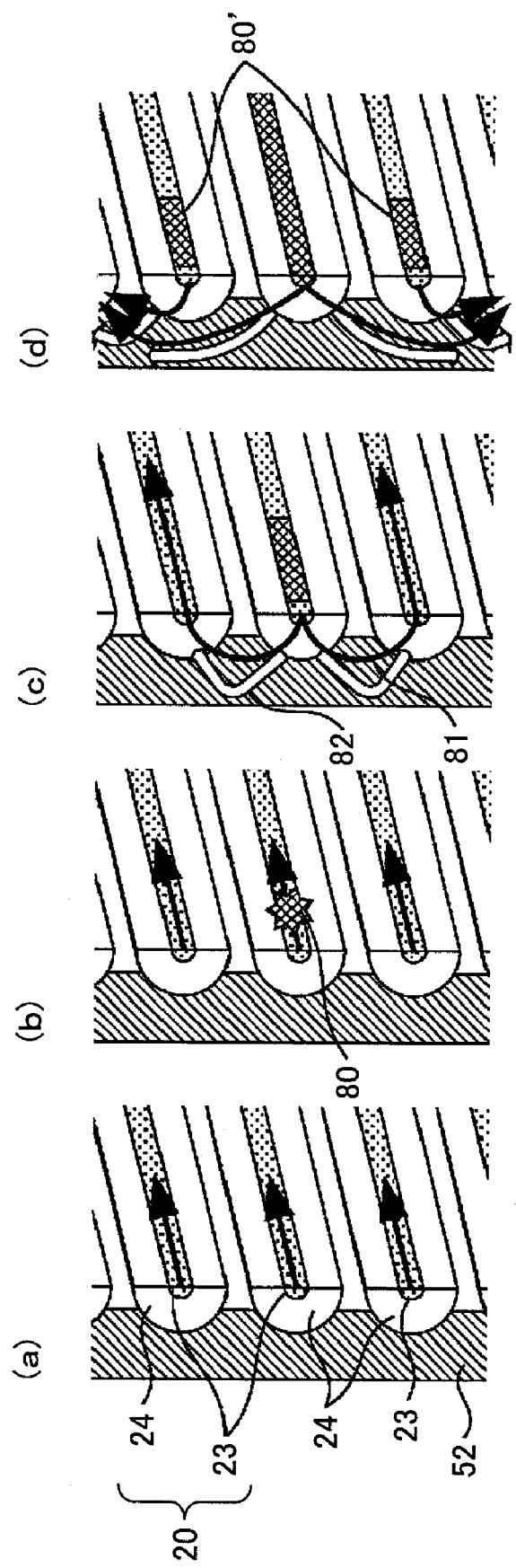
FIG. 5 is schematic illustrations showing perspective cross sectional views explaining a quench protection function for a superconducting magnet according to the present invention.

FIG. 5 is schematic illustrations showing perspective cross sectional views explaining a quench protection function for a superconducting magnet according to the present invention. For simplicity of illustration, the superconducting coil wire 20 in FIG. 5 contains only one superconducting filament 23. However, the below-described quench protection function of the invention is the same for a superconducting coil wire 20 containing multiple superconducting filaments 23.

FIG. 5(*a*) shows a state in which no quench occurs. A current indicated by a black arrow flows through the filament 23 of each turn of the superconducting coil wire 20.

FIG. 5(*b*) shows a state in that a quench occurs in a filament region 80 of a turn of the superconducting coil wire 20. The filament region 80 starts to have a non-zero electrical resistance.

FIG. 5(c) shows a state in that the quench propagates a little further from the state of FIG. 5(b). The quench region 80 becomes extended because of propagation of the quench, which further increases the electrical resistance of the quench initiation turn of the superconducting coil wire 20 containing the extended quench region 80. As a result, a current 81 flows from the quench initiation turn of the wire 20 into each neighboring turn of the wire 20 through the metal patch 52 therebetween. At the same time, a heat flow 82 also occurs from the quench initiation turn of the wire 20 into each neighboring turn of the wire 20.

FIG. 5(d) shows a state in that the current and heat flow between neighboring turns of the wire 20 further proceeds from the state of FIG. 5(c). Each neighboring turn of the wire 20 is heated by the heat flow 82 from the quench initiation turn of the wire 20, which in turn decreases the critical current density of the neighboring turn of the wire 20. At the same time, the current density of the neighboring turn of the wire 20 increases due to the current flow 81 from the quench initiation turn of the wire 20. Both of these effects are combined to generate a new quench region 80' in the neighboring turn of the wire 20. Then, a similar heat and current flow repeats from the wire turn containing the new quench region 80' into its own neighboring wire turns.

As described above, according to the invention, when a quench occurs in a filament region of a turn of a superconducting coil wire 20, the heat and current in the coil turn due to the quench are transferred to each neighboring coil turn of the wire 20 through the metal patch 52 therebetween. Thus, the quench propagation can be accelerated. The faster the quench propagation velocity is, the lower are the maximum temperatures that the quench regions 80 and 80' may reach. As can be understood from the above discussion, the metal patches 52 have the function of lowering the maximum temperatures that the quench regions 80 and 80' may reach, and therefore have the effect of preventing burnout of the superconducting coil 2.

As described, the metal patches 52 have the function of accelerating quench propagation. As a result, the superconducting coil wire 20 starts to have a larger number of quench regions having non-zero resistance. Thus, the quench voltage is increased. Quench voltages are widely used for quench detection. For example, the voltage across a superconducting coil is monitored by a diode. And, when the voltage across the coil exceeds a threshold voltage of the diode, it is determined that a quench has occurred. As described, the metal patches 52 of the invention have the function of increasing the quench voltage of the superconducting coil 2. Therefore, the occurrence of a quench can be more readily detected even if there are loud background noises.

The function and effect of the metal patches 52 of the present invention are fundamentally different from the cooling plate disclosed in the aforementioned Hayashi et al. The cooling plate of Hayashi et al is inserted through a superconducting coil and connected to cooling flanges (corresponding to the heat transfer plates 30 of the invention) in order to transfer heat between the coil and the flanges and to cool the superconducting coil. Thus, the cooling plate of Hayashi et al probably needs to have good thermal contact with the cooling flanges.

In contrast to conventional technologies such as Hayashi et al, the metal patches 52 of the invention are for the purposes of readily transferring current and heat between neighboring turns of the superconducting coil wire 20 and of accelerating quench propagation. Therefore, the metal patches 52 do not need to be connected to the heat transfer plates 30. For the same reason, the metal patches 52 do not need to be connected to one another. Thus, the invention can employ such a structure in which all the metal patches 52 are separated from one another by the circumferential slits 53 and the axial slits 54. In addition, the circumferential slits 53 and the axial slits 54 have another effect of reducing time required for energizing and deenergizing the superconducting magnet 1 (which will be described below).

Figure 6:
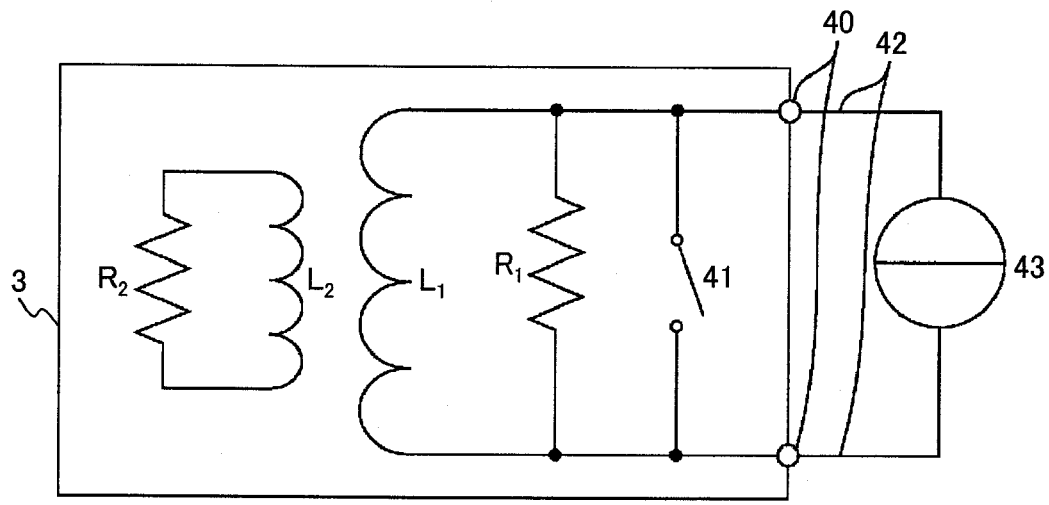
FIG. 6 is an equivalent circuit diagram for the superconducting magnet shown in FIG. 1.

The function and effect of the present invention in energizing the superconducting magnet 1 will now be described. FIG. 6 is an equivalent circuit diagram for the superconducting magnet 1 shown in FIG. 1. In FIG. 6, L1 denotes the equivalent inductance of the superconducting coil 2; L2 denotes the equivalent inductance of the current and heat conducting portion 50; R1 denotes the equivalent resistance of the wire immobilizing material 22 filled in the circumferential slits 53; and R2 denotes the equivalent resistance of the wire immobilizing material 22 filled in the axial slits 54. While, the equivalent resistance of the metal patches 52 is very small compared to R1 and R2, and is therefore neglected.

When the superconducting coil 2 is energized, the current supplied from the current source 43 into the current port 40 is increased. During this operation, the persistent current switch 41 is maintained in a non-superconducting (high electrical resistance) state in order to prevent current from flowing through the switch 41. When the current through the superconducting coil 2 is increased, the magnetic flux through the coil 2 increases. As a result, eddy currents are induced in the metal patches 52 in such a manner to reduce the increase in the magnetic flux through the coil 2. However, such eddy currents are attenuated by the equivalent resistance R2 of the wire immobilizing material 22 filled in the axial slits 54. Thus, the eddy currents can be practically removed by increasing the equivalent resistance R2 (for example, by using an insulation resin as the wire immobilizing material 22). In such a non-eddy-current condition, when the current supplied to the current port 40 is increased, a voltage V expressed by "L1×dI/dt" is generated across the superconducting coil 2 according to Faraday's Law.

On the other hand, in FIG. 6, the time constant T of the parallel RL circuit branch consisting of R1 and L1 is "L1/R1". That is, a rise time required for supplying the superconducting coil 2 with the operating current $I_{op}$ is proportional to "L1/R1". As described above, according to the first embodiment of the invention, the metal patches 52 are axially separated by the circumferential slits 53 and each circumferential slit 53 is filled with a high electrical resistivity material 22 (such as an insulation resin). Thereby, the equivalent resistance R1 of the circumferential slits 53 can be increased, and, as a result, the rise time required for energizing the superconducting coil 2 can be reduced.

Second Embodiment of the Invention

Figure 7:
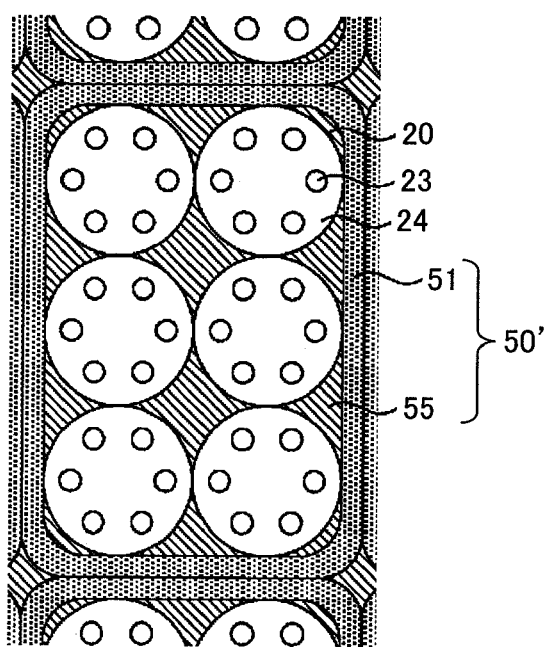
FIG. 7 is a schematic illustration showing an enlarged cross sectional view of an exemplary arrangement of a superconducting coil wire and a metallic member of a current and heat conducting portion according to a second embodiment of the invention.

FIG. 7 is a schematic illustration showing an enlarged cross sectional view of an exemplary arrangement of a superconducting coil wire and a metallic member of a current and heat conducting portion according to a second embodiment of the invention. As illustrated in FIG. 7, a current and heat conducting portion 50' of the second embodiment includes an insulation layer 51 and a metallic filler 55 (as a metallic member) having good heat conductance. Multiple superconducting coil wires 20 are bundled. The space among the superconducting coil wires 20 in the bundle is filled with the metallic filler 55 having good heat conductance. Thus, the superconducting coil wires 20 in the bundle are electrically and thermally sufficiently connected to one another.

In FIG. 7, the bundle contains two layers of superconducting coil wires 20, but may contain one layer or more than two layers. The bundle of superconducting coil wires 20 is covered with the insulation layer 51, and therefore each turn of the bundle is electrically insulated from the neighboring turns of the bundle. The insulation layer 51 is formed around the bundle of superconducting coil wires 20 before the bundle is wound around a bobbin 21. The metallic filler 55 is filled in the bundle of superconducting coil wires 20 before or after the winding of the bundle.

The metallic filler 55 of the second embodiment is preferably a good thermally and electrically conductive metal paste (e.g., a high density metal powder in a resin). For example, the use of a silver paste as the metallic filler 55 provides an electrical resistivity of 10 $\mu\Omega\cdot$cm or less and a thermal conductivity of 65 W/m·K or more. Similarly to the metal patches 52 of the first embodiment, the metallic filler 55 of the second embodiment has the function of transferring current and heat between neighboring superconducting coil wires 20. In addition, the metallic filler 55 of the second embodiment also has the function of immobilizing the superconducting coil wires 20 in the bundle wound around the bobbin 21.

The metallic filler 55 of the second embodiment has a larger contact area with the superconducting coil wire 20 than the metal patches 52 of the first embodiment. Thus, according to the second embodiment, the electrical and thermal contact between neighboring superconducting coil wires 20 can be structurally increased compared to the first embodiment. However, the metallic filler 55 of the second embodiment contains a resin, and therefore may have electrical and thermal conductivities lower than the metal patch 52 of the first embodiment. Hence, a superconducting coil 2 is designed by comparing the above-mentioned advantage of the superior properties of the metallic member used in the first embodiment and the structural advantage of the second embodiment.

Third Embodiment of the Invention

Figure 8:
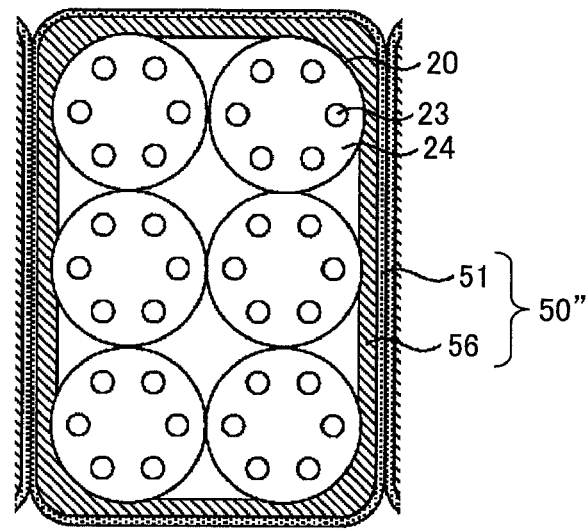
FIG. 8 is a schematic illustration showing an enlarged cross sectional view of an exemplary arrangement of a superconducting coil wire and a metallic member of a current and heat conducting portion according to a third embodiment of the invention.

FIG. 8 is a schematic illustration showing an enlarged cross sectional view of an exemplary arrangement of a superconducting coil wire and a metallic member of a current and heat conducting portion according to a third embodiment of the invention. As shown in FIG. 8, a current and heat conducting portion 50" of the third embodiment includes an insulation layer 51 and a metal layer 56 (as a metallic member) having good heat conductance. Multiple superconducting coil wires 20 are bundled. The bundle of the superconducting coil wires 20 is surrounded by the metal layer 56 having good heat conductance. Thus, the superconducting coil wires 20 in the bundle are electrically and thermally sufficiently connected to one another. The metal layer 56 is further surrounded by the insulation layer 51, and therefore each turn of the bundle is electrically insulated from the neighboring turns of the bundle.

In FIG. 8, the bundle contains two layers of superconducting coil wires 20, but may contain one layer or more than two layers. The insulation layer 51 and metal layer 56 are preferably integral in view of ease of winding. However, they may be separate. In addition, one or more metal sheets (not illustrated) may be disposed in the bundle in such a manner that each metal sheet is in contact with a plurality of the superconducting coil wires 20.

According to the third embodiment, a superconducting coil 2 can be formed by just bundling a plurality of superconducting coil wires 20, then surrounding the bundle by a current and heat conducting portion 50", and then winding the bundle around a bobbin 21. In contrast, in the second embodiment, a wire immobilizing metallic filler 55 needs to be filled in the space among the superconducting coil wires 20 in the bundle. Thus, the third embodiment has an advantage over the second embodiment in terms of ease of manufacturing. However, in the third embodiment, the space among the superconducting coil wires 20 in the bundle is not filled with any immobilizing material. Therefore, the superconducting coil wires 20 may move because of electromagnetic forces, thus potentially generating undesirable frictional heat. Hence, when a superconducting magnet 1 is designed to have sufficient cooling capability at the operating temperature and therefore to be stable against thermal disturbance created by frictional heat, the superconducting coil 2 of the third embodiment can be advantageously used to reduce the manufacturing cost.

Fourth Embodiment of the Invention

The present invention can also be applied to immersion cooled superconducting magnets. Immersion cooled superconducting magnets are cooled to the operating temperature by making the superconducting coil come in thermal contact with a refrigerant (i.e., by immersing the coil in the refrigerant). As described above, the current and heat conducting portions 50, 50' and 50" of the first, second and third embodiments do not need to be connected to the heat transfer plates 30, unlike the cooling plates of the aforementioned Hayashi et al. Therefore, the quench protection function and effect of the invention also works well for superconducting magnets having no heat transfer or cooling plates. An example of a superconducting magnet immersed in a liquid refrigerant will be described below. Incidentally, instead of a liquid refrigerant, a solid refrigerant (such as solid hydrogen, solid neon, solid nitrogen, and solid argon) may be used.

Figure 9:
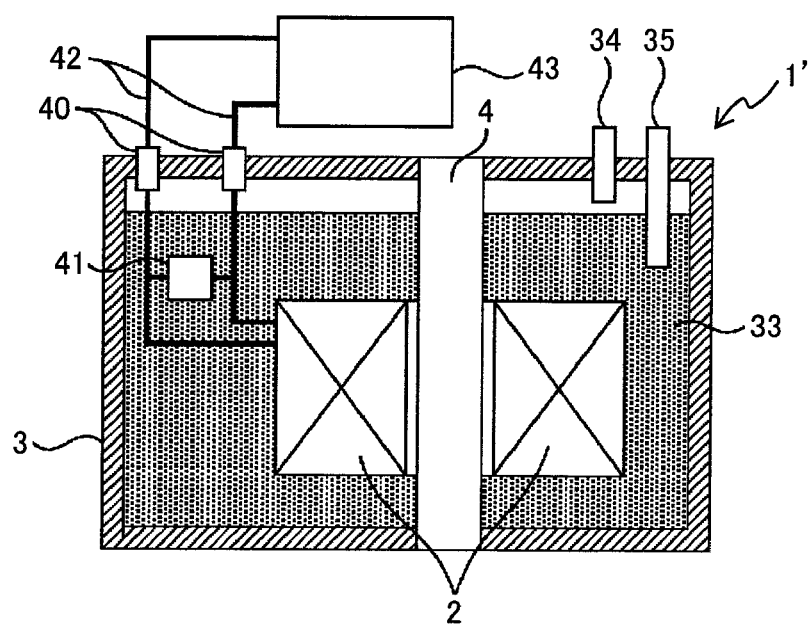
FIG. 9 is a schematic illustration showing a cross sectional view of another exemplary configuration of a superconducting magnet according to the present invention.

FIG. 9 is a schematic illustration showing a cross sectional view of another exemplary configuration of a superconducting magnet according to the present invention. As illustrated in FIG. 9, a superconducting magnet 1' of the invention includes a superconducting coil 2. The superconducting coil 2 is cooled to the operating temperature by a liquid refrigerant 33 (such as liquid hydrogen, liquid neon, liquid nitrogen, and liquid argon) that is in thermal contact with the coil 2. The superconducting magnet 1' includes: a heat insulating container 3 for containing the liquid refrigerant 33 and the coil 2; an exhaust port 34 for exhausting a high pressure vapor of the refrigerant 33 outside the container 3; and a charge port 35 for charging a new liquid refrigerant 33 into the container 3.

When heat infiltrates into the container 3 from the outside or heat is generated inside the container 3, part of the liquid refrigerant 33 vaporizes and the latent heat of vaporization prevents the temperature of the coil 2 from elevating. The pressure inside the container 3 is maintained at a safe level by exhausting the vaporized refrigerant outside the container 3 through the exhaust port 34. When the amount of the liquid refrigerant 33 in the container 3 decreases due to vaporization, a new liquid refrigerant 33 is charged into the container 3 through the charge port 35.

In the immersion cooled superconducting magnet 1', the superconducting coil 2 is surrounded by the liquid refrigerant 33. Therefore, the superconducting magnet 1' can maintain the superconducting coil 2 at the operating temperature more stably than the superconducting magnet 1 shown in FIG. 1. However, the superconducting magnet 1' uses a refrigerant, thus incurring a weight increase. In addition, the superconducting magnet 1' requires a monitor for measuring the amount of the refrigerant and also requires recharging of the refrigerant.

As has been described, in the superconducting magnet according to the present invention, each superconducting coil wire (or each coil turn) is electrically and thermally connected to the neighboring coil wires (or coil turns) by one or more metallic members having good electrical and thermal conductance. Thus, current and heat are quickly transferred between neighboring superconducting coil wires (or coil turns), thereby preventing burnout of the superconducting coil caused by a quench in the coil. Furthermore, in the first embodiment of the invention, a plurality of metallic members (metal patches) for heat and current transfer are axially and circumferentially electrically separated from one another, thereby reducing time required for energizing and deenergizing the superconducting coil.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A superconducting magnet comprising a superconducting coil wherein the superconducting coil includes:
    a bobbin;
    one or more superconducting wires wound around the bobbin in a plurality of turns, each superconducting wire being one or more superconducting filaments embedded in a matrix; and
    one or more metallic members, each metallic member being in electrical and thermal contact with a plurality of portions of the one or more superconducting wires.

2. The superconducting magnet according to claim 1, wherein: the one or more metallic members include a plurality of metallic members; and each pair of neighboring ones of the plurality of metallic members which are next to each other in a circumferential direction of the bobbin is separated from each other by a corresponding slit.

3. The superconducting magnet according to claim 2, wherein each metallic member extends parallel to the outer circumferential surface of the bobbin, and is a block, a sheet, a strip, or a net in form.

4. The superconducting magnet according to claim 2, wherein each pair of neighboring ones of the plurality of metallic members which are next to each other in an axial direction of the bobbin is separated from each other by a corresponding slit.

5. The superconducting magnet according to claim 2, wherein: the one or more superconducting wires include a plurality of superconducting wires; and the plurality of superconducting wires are bundled and surrounded by an insulation cover.

6. The superconducting magnet according to claim 1, wherein the superconducting magnet is operated at an absolute temperature of 10 K or higher.

7. A nuclear magnetic resonance apparatus comprising the superconducting magnet according to claim 1.

* * * * *